Nov. 19, 1968 F. P. HEIMAN ET AL 3,411,199

SEMICONDUCTOR DEVICE FABRICATION

Filed May 28, 1965 3 Sheets-Sheet 1

INVENTORS
FREDERIC P. HEIMAN &
KARL H. ZAININGER

Glenn H. Bruestle
Attorney

INVENTORS
FREDERIC P. HEIMAN &
BY KARL H. ZAININGER

Glenn H. Bruestle
Attorney

INVENTORS
FREDERIC P. HEIMAN &
KARL H. ZAININGER

[signature]
Attorney

United States Patent Office 3,411,199

Patented Nov. 19, 1968

3,411,199

SEMICONDUCTOR DEVICE FABRICATION

Frederic P. Heiman and Karl H. Zaininger, Princeton, N.J., assignors to Radio Corporation of America, a corporation of Delaware Filed May 28, 1965, Ser. No. 459,709
10 Claims. (Cl. 29—571)

ABSTRACT OF THE DISCLOSURE

The conductivity of that portion of the channel of an offset insulated gate field effect transistor which is not covered by the gate electrode is increased by heating the transistor in a hydrogen-containing ambient after the formation of the gate electrode.

This invention relates to improved methods of fabricating semiconductive devices, and more particularly to improved methods of introducing or forming a conductive channel in semiconductive devices.

In the fabrication of certain types of semiconductor devices, e.g., those known as MOS transistors, a thin conductive channel or region is formed in a crystalline semiconductive wafer. Conductive channels have been formed in semiconductive wafers by alloying a quantity of a conductivity type-determining substances or modifier (a substance which is either an acceptor or a donor in the particular semiconductor employed) to the surface of the wafer. Conductive channels have also been formed in a semiconductive wafer by diffusing a conductivity modifier through all or part of the wafer surface. Another method of forming a conductive channel is to deposit heavily doped low resistivity semiconductive material as a thin epitaxial layer on a high resistivity wafer of the same semiconductive material.

It is known that when some crystalline semiconductive bodies are heated to high temperatures, a thin surface layer of the body is often converted to opposite conductivity type. For example, when a P type silicon wafer is heated in steam or in ordinary oxidizing ambients such as air or oxygen to form a silicon oxide surface layer on the surface of the wafer, a thin surface region of the wafer immediately beneath the silicon oxide layer tends to become N type. However, the N type surface region thus produced is not presently preferred for use as a conductive channel in the kind of semiconductor device known as an insulated gate field-effect device, because the surface states of crystalline silicon wafers are very sensitive to surface preparation, oxidation processes, and the past history of the silicon crystal, so that results obtained depend on the specific treatments utilized during fabrication. It is believed that the ordinary N type inversion layer formed by oxidizing a silicon body in steam or in other conventional ambient has a great many associated surface states which act as traps, and tend to immobilize charge carriers, thus decreasing the transconductance of the device to undesirable levels.

In the fabrication of some kinds of semiconductor devices, such as insulated gate field-effect devices. it is desirable that the conductive channels in a large number of units be closely similar as to size, shape, and resistivity, in order to insure uniforimty in the electrical parameters of the completed device. For some types of these devices, it is also desirable that the conductive channel be non-uniform in its electrical resistivity from one end of the channel to the other end, although the conductive channel should nevertheless be similar from device to device.

It is an object of this invention to provide improved methods of fabricating improved semiconductor devices. It is another object of the invention to reduce the time and cost of fabricating thin conductive channels in semiconductive devices.

Still another object is to provide improved methods of forming, in crystalline semiconductive wafers, conductive channels that are uniform from wafer to wafer.

But aonther object is to provide a rapid and inexpensive method of forming in a semiconductive wafer a thin conductive channel which is non-uniform in conductivity from one end of the channel to the other end.

The present method of forming a conductive channel in a crystalline semiconductive body comprises the steps of forming an insulating coating over one face of said body; depositing a metallic electrode over a portion of said coating, leaving the remaining portion of said coating uncovered by said electrode; and treating said body in an ambient capable of increasing the conductivity of that portion of said one face uncovered by said electrode.

The invention and its features will be described in greater detail with reference to the accompanying drawing, in which.

Figure 1:
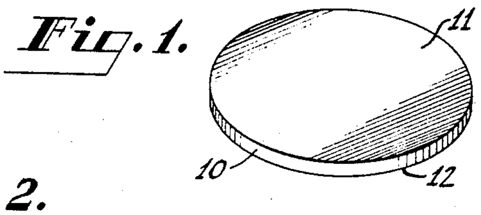
FIGURE 1 is a perspective view of a semiconductive wafer.
Figure 2:
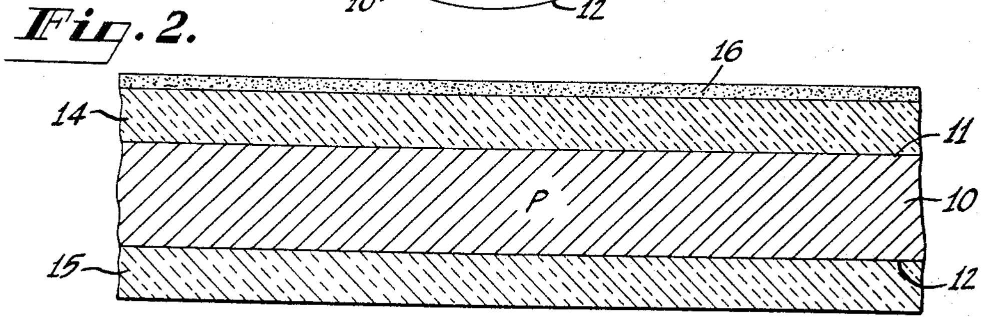
FIGURES 2–12 are cross-sectional views of a portion of the semiconductive wafer of FIGURE 1 during successive steps in the fabrication of a semiconductor device in accordance with one embodiment of the present method.
Figure 3:
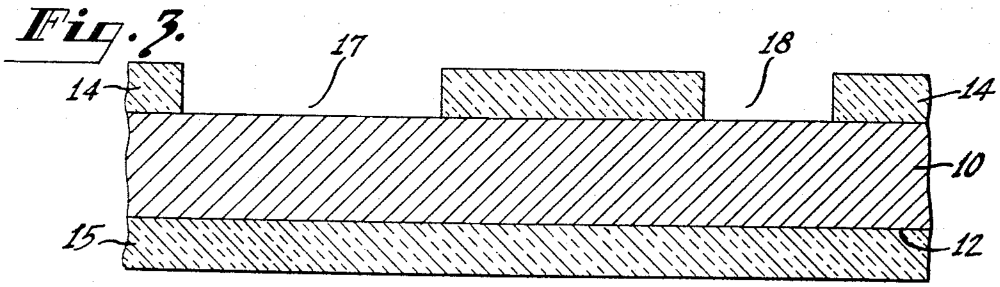
Figure 4:
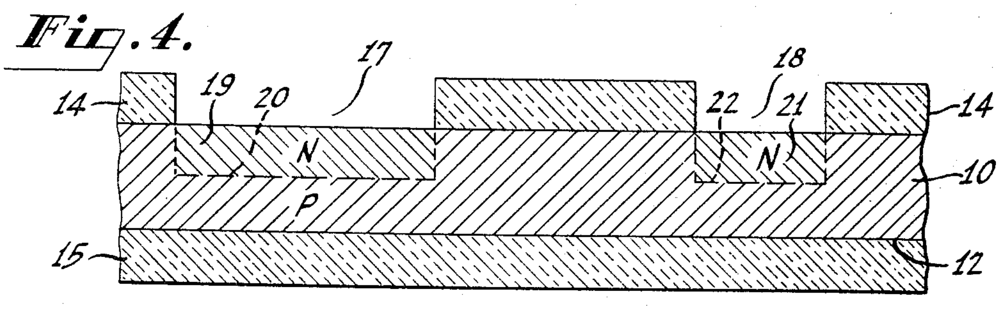

The type of semiconductor device in which the conductivity of a portion of a semiconductive wafer may be modulated by an applied electric field is known as a field-effect device. One kind of field-effect device comprises a semiconductive wafer which has an insulating layer over a portion of one surface thereof, and has a control electrode disposed on this insulating layer and spaced thereby from the surface of the wafer. Units of this kind are known as insulated gate field-effect devices, and generally comprise a layer or wafer of crystalline semiconductive material; two spaced conductive regions adjacent one face of said semiconductive material; a film of insulating material on said one face between said two spaced regions; two conductive metallic electrodes bonded to said two spaced conductive regions respectily; and a conductive metallic electrode on said insulating film over the gap or space between said two spaced regions.

One class of insulated gate device is known as the MOS (Metal-Oxide Semiconductor) transistor, and is described by S. R. Hofstein and F. P. Heiman in "The Silicon Insulated-Gate Field-Effect Transistor," Proc. IEEE, volume 51, p. 1190, September 1963. In devices of this type, the metallic control electrode on the insulating film (the film may for example consist of silicon oxide) is also known as the gate electrode, while the two electrodes bonded directly to the semiconductive wafer are known as the source and drain electrodes.

MOS transistors may be of two general types, one type being known as the enhancement type, and the other as the depletion type. In depletion type MOS transistors, there is a thin conductive channel adjacent the wafer surface between the source and drain regions. In devices of this type, a drain current will flow even when the gate bias is zero. When a negative gate bias is applied to depletion type MOS transistors having an N type conductive channel, the conductivity of the conductive channel is decreased or "pinched off" and the source-drain current is decreased. When a positive gate bias is applied to these devices, the conductivity of the channel increases, and the source-drain current increases. In depletion type MOS transistors having a P type conductive channel, the applied gate bias must be reversed in polarity to produce the same effect. Thus both positive and negative gate biases are effective in modulating the drain current of depletion type MOS transistors.

In one class of MOS transistors known as offset gate units, the control or gate electrode lies over only a portion of the conductive channel between the source and drain regions of the device. For a description of this type of device, see F. P. Heiman and S. R. Hofstein, "Metal-Oxide-Semiconductor Field-Effect Transistors," Electronics, Nov. 30, 1964, pp. 50–61.

Although the present method will be described in terms of an offset gate depletion type MOS transistor as a specific example, the method may also be applied to the fabrication of other types of semiconductor devices in which it is desired to fabricate a conductive channel in a crystalline semiconductive wafer beneath an insulating layer.

*Example I*

A crystalline silicon wafer 10 (FIGURE 1) is prepared with two opposing major faces 11 and 12. The precise size, shape, conductivity type and resistivity of the wafer 10 is not critical. The wafer 10 may be of P type conductivity, or intrinsic, or of N type conductivity. In this example, the wafer 10 is a disc-shaped transverse slice of a monocrystalline P type ingot, and has a resistivity of about 1 to 100 ohm-cm. Suitably, the wafer 10 is about ¾ of an inch in diameter and 6 mils thick. It will be understood that a large number of units are simultaneously fabricated from a wafer of this size. In FIGURES 2–12, only a small portion of the entire semiconductive wafer 10, and only small portions of the two opposing major faces 11 and 12, are shown for greater clarity.

A silicon oxide coating is deposited over the surface of the wafer 10 by any convenient method. Since this coating is subsequently removed, its exact thickness is not critical. When the wafer 10 consists of silicon, as in this example, the silicon oxide layer may be formed by heating the wafer in steam for about 30 minutes at about 1050° C. Silicon oxide coatings 14 and 15 (FIGURE 2) are thus grown on major faces 11 and 12 respectively of the wafer. A thin layer 16 of a photoresist is deposited on one oxide coating 14. The photoresist 16 may, for example, be a bichromated protein such as bichromated gum arabic, or may be a commercially available photoresist.

The photoresist layer 16 is exposed to a suitable light pattern, and developed. Those portions of the photoresist not exposed to light are removed by means of a suitable solvent, thereby exposing portions of silicon oxide layer 14. The hardened, polymerized portions of the photoresist which remain on silicon oxide layer 14 serve as a mask during the subsequent etching step. The exposed portions of the silicon oxide layer 14 are removed by means of an etchant such as a hydrofluoric acid solution. The polymerized portions of the photoresist are then removed by means of a suitable stripper such as methylene chloride, leaving wafer 10 as in FIGURE 3, with a pair of openings 17 and 18 formed in the silicon oxide layer 14 on the wafer 10.

The exact size and shape of openings 17 and 18 are not critical; they may be regular shapes such as polygons or circles, or may be irregular in shape. When the source and drain regions of an MOS transistor have the same size and shape, the device is symmetrical, that is, source and drain regions may be interchanged without affecting electrical characteristics of the device. In this example, the openings 17 and 18 are rectangular, but the area of one opening 18 is made very small, for example, about 30 square mils, and is smaller than the area of the other opening 17. It has been found that improved operation at elevated frequencies is obtained by making the drain area of an MOS transistor very small. The area of the source region does not appreciably affect the high frequency performance of the device, and hence may be made relatively large for greater ease in bonding lead wires.

Wafer 10 is next heated in an ambient containing phosphorus pentoxide vapors for about 10 to 20 minutes at about 1000° C. Phosphorus diffuses into the exposed portions of wafer face 11 to form two phosphorus diffused regions 19 and 21 (FIGURE 4) immediately beneath openings 17 and 18 respectively. Since phosphorus is a donor in silicon, and the wafer 10 is originally of P type conductivity, rectifying barriers or p-n junctions 20 and 22 are formed at the boundaries between the N type phosphorus-diffused regions 19 and 21 respectively and the P type bulk of wafer 10. Under these conditions, the N type phosphorus-diffused regions 19 and 21 may be about 5000 to 20,000 Angstroms thick, depending on the period of heating and the concentration of the phosphorus pentoxide vapors. In this example, the exposed surface area of region 21 is less than the exposed surface area of region 19, as the area of opening 18 was less than the area of opening 17.

Figure 5:
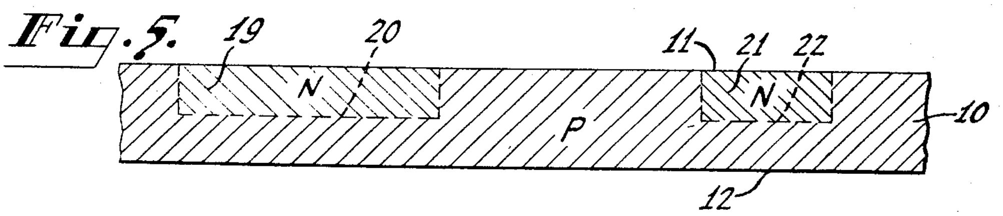
Figure 6:
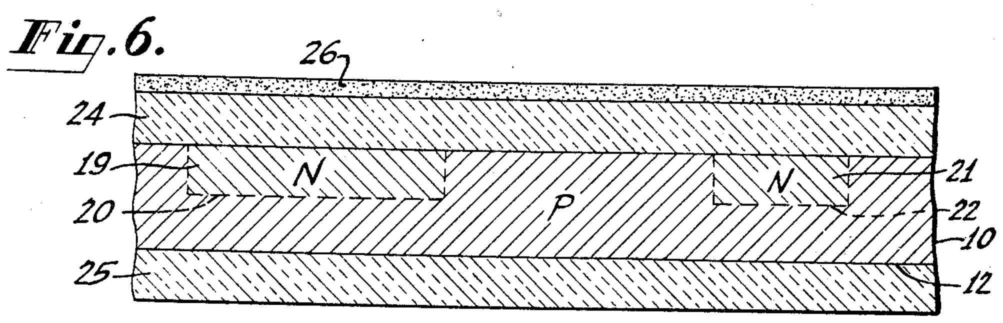
Figure 7:
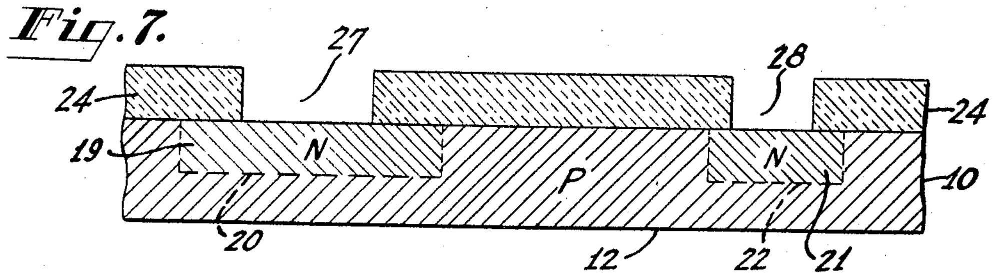
Figure 8:
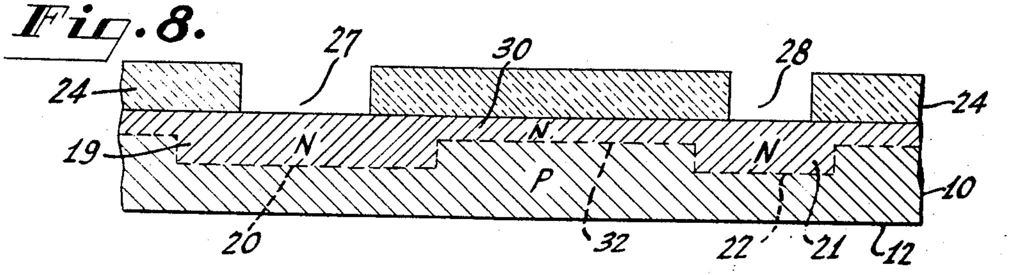
Figure 9:
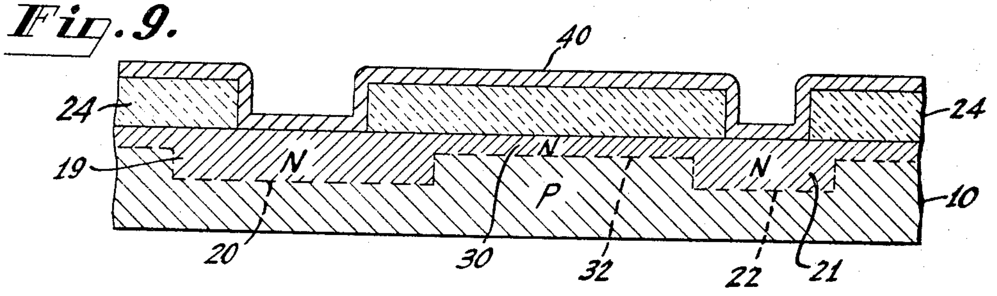

Wafer 10 is now treated in an etchant containing hydrofluoric acid so as to completely remove the oxide layer 15 and the remaining portions of the oxide layer 14, leaving the wafer as in FIGURE 5.

Wafer 10 is reheated in an ambient of pure dry oxygen for a time and at a temperature sufficient to form a silicon oxide coating or layer thereon. The exact time and temperature of this heating step is not critical. At higher temperatures, a shorter heating time may be utilized. At low temperatures, a longer heating time is required to produce the same coating thickness. In this example, wafer 10 is heated at about 1000° C. for about 3 to 4 hours. Clean new silicon oxide coatings 24 and 25 (FIGURE 6) about 1000 to 3000 Angstroms thick are thus formed on wafer faces 11 and 12 respectively. It has been found that when oxide coatings are formed on silicon wafers in this manner, in the absence of moisture or impurities, the tendency for silicon wafers to develop surface inversion layers is minimized.

A thin layer 26 (FIGURE 6) of photoresist is deposited on silicon oxide coating 24. The photoresist layer 26 is exposed to a suitable light pattern. Unexposed portions of the photoresist are then removed by any suitable solvent, thereby exposing portions of silicon oxide layer 24. The exposed portions of silicon oxide layer 24, as well as all of silicon oxide layer 25, are then removed by means of a hydrofluoric acid solution. The remaining portions of the photoresist are then removed with a suitable stripper, leaving the wafer as in FIGURE 7, with contact openings 27 and 28 extending through the oxide coating 24 to the face 11 of wafer 10. The exact size and shape of contact openings 27 and 28 is not critical, but openings 27 and 28 are entirely within the surface boundary of the phosphorus-diffused N type regions 19 and 21 respectively.

Wafer 10 is now heated in a reducing ambient such as hydrogen or a mixture of hydrogen and a non-oxidizing gas such as argon, nitrogen, or the like. Mixtures of nitrogen and a few volume percent hydrogen are useful for this purpose, and are known as forming gas. A suitable forming gas consists of 90 volumes of nitrogen and 10 volumes of hydrogen. The heating step is preferably conducted at temperatures of about 200° C. to 700° C. At about 700° C., heating for less than a minute is sufficient. If the heating temperature is decreased, the time of heating is increased. During this step, a thin surface region 30 (FIGURE 8) of wafer 10 beneath the silicon oxide coating 24 is converted to N type conductivity. The thin surface region 30 is known as an inversion layer, and when formed in this manner is sufficiently trap-free to be utilized as a conductive channel. A p-n junction 32 is formed at the boundary between the inversion layer 30 and the bulk of wafer 10.

The inversion layer 30 thus formed is too thin for accurate direct measurement. The thicknesses of the various wafer regions in the drawing are not to scale, and have been exaggerated for greated clarity. Layer 30 is estimated to be of the order of 100 Angstroms thick. Although the thickness of the conductive channel or inversion layer 30 is thus less than the length of a single wave of visible light, the presence of the conductive channel after this treatment may be demonstrated by placing two probes against the wafer surface on the two regions 19 and 21 respectively, and measuring with an ammeter the current which flows between the two probes for a given applied voltage. When such measurement is made on a wafer that does not have a conductive channel or surface region, the assemblage acts like a pair of diodes back-to-back, and very little current flows for a given applied voltage. When such measurement is made on a wafer that does have a conductive channel or surface region 30 between the regions 19 and 21, a substantial current flows for a similar applied voltage. Suitably, the resistance of the channel 30 in this example is about 10 to 100 ohms.

The silicon body 10 is cooled to room temperature, and a film 40 (FIGURE 9) of a conductive metal is deposited by any convenient method over the remaining portion of oxide layer 24 and over the exposed portions of wafer face 11. In this example, film 40 consists of chrome-gold or chrome-silver, is about 3000 to 6000 Angstroms thick, and is deposited by evaporation. A thin film of chromium is deposited first, and a layer of gold or silver is then deposited by vacuum evaporation on the chromium.

Desired portions of the chrome-gold film 40 on wafer regions 19 and 21 and on a portion of the oxide layer 24 between wafer regions 19 and 21 are now masked, utilizing either the photoresist techniques described above, or an acid resist (not shown) such as paraffin wax, apiezon wax, or the like. The unmasked portions of metal film 40 are removed by means of a suitable etchant, and the resist is dissolved by a suitable organic solvent, leaving a first portion of the metallic film as an electrode 41 (FIGURE 10) in contact with wafer region 19; a second portion of the metallic film as an electrode 43 in contact with wafer region 21; and a third portion as an electrode 42 on the silicon oxide coating 24. Since the device of this example is an offset gate unit, the electrode 42 covers only part of the conducting channel 30.

As a series drain resistance merely increases the drain voltage at which the drain current saturates, while a series source resistance introduces undesirable degeneration, it is preferred to offset the gate electrode so that one end of the gate electrode extends directly over the source region, and overlaps it slightly, while the other end of the gate electrode extends over part of the conductive channel, but does not extend across the entire gap between the source and drain regions. The feedback capacitance of the device is thus reduced, since the active channel length is forced to coincide with that portion of the gate electrode which lies over the channel.

Figures 10, 11, 12, 13, 14:
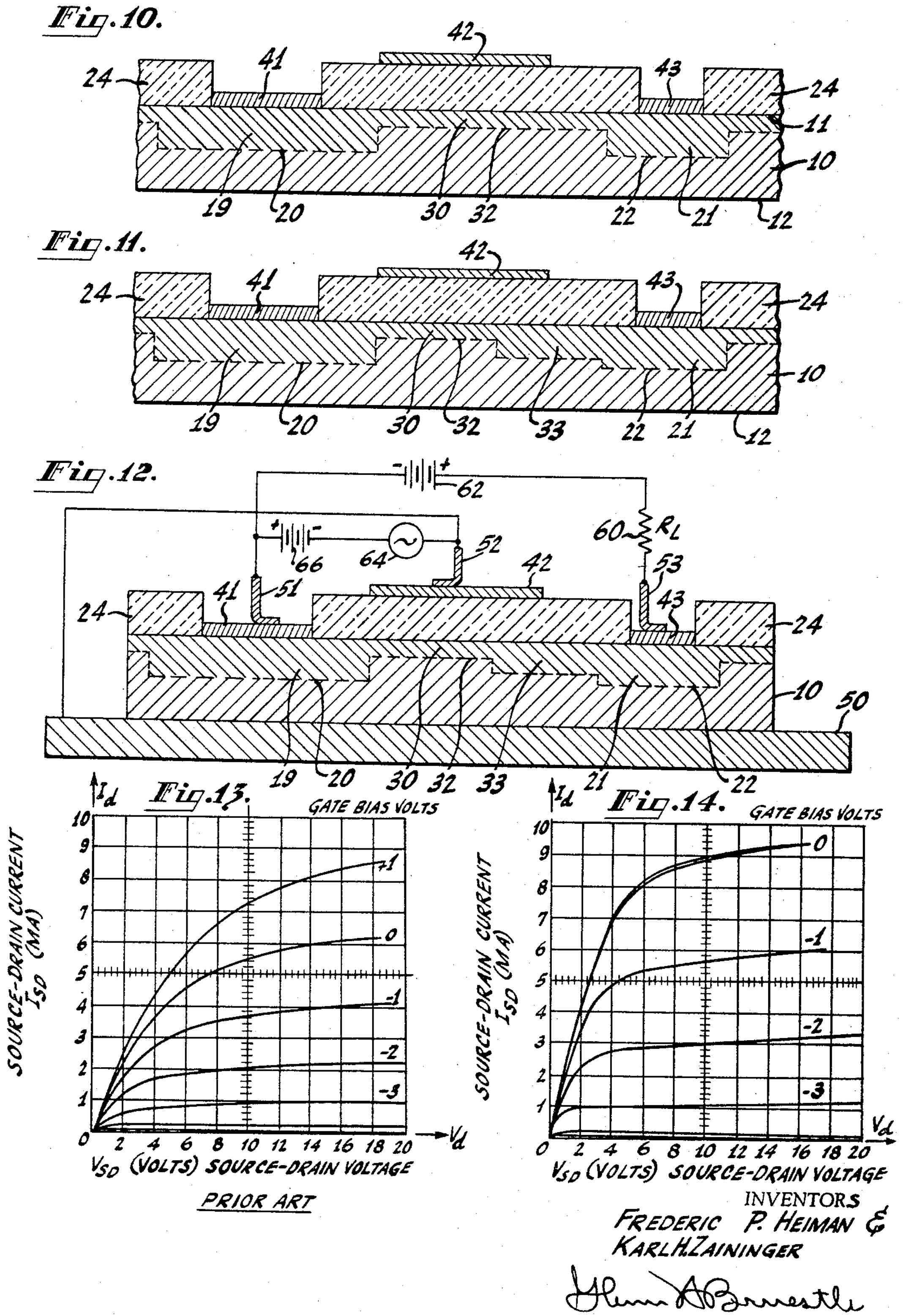
FIGURE 13 is a plot of the electrical characteristics of a prior art device which is comparable to the device illustrated in FIGURE 12.
FIGURE 14 is a plot of the electrical characteristics of the device of FIGURE 12, showing the characteristic variation in the source-drain current with source-drain voltage for different values of source-gate bias.

The wafer 10 is now reheated in hydrogen, or in a hydrogen-containing ambient such as forming gas, for a few minutes at a temperature of about 200° C. to 700° C. As a result of this step, the hydrogen increases the conductivity of the uncovered portion only of channel 30. The portion of channel 30 which is covered by the electrode 42 is not affected by this step, since the metal electrode 42 appears to act as a mask against the diffusion of hydrogen. It is preferred that the electrode 42 consists of dense alloys, or of dense metals such as gold and silver, which are capable of acting as a mask against the diffusion of hydrogen. In FIGURE 11, the uncovered portion of the conductive channel 32 which is given increased conductivity by this step has been legended 33, and is shown, for greater clarity, as thicker than the remainder of channel 30. It will be understood that portion 33 of the conductive channel differs from the remainder of original channel 30 principally in that portion 33 is more conductive than the remainder of channel 30.

The device is completed (FIGURE 12) by bonding electrical lead wires 51, 52 and 53 to electrodes 41, 42 and 43 respectively by any convenient method such as soldering, or thermocompression bonding. Each portion 10′ may now be cut from the wafer to form a plurality of individual units. An individual portion 10′ of the wafer is mounted with major face 12 down on a metallic header 50. The subsequent steps of encapsulating and encasing the device are accomplished by standard techniques of the semiconductor art, and need not be described here.

The device of this example may be operated as follows. Leads 51 and 53 are the source and drain leads respectively, while lead 52 is the control or gate lead. The load, shown as a resistance 60, together with a source of direct current potential, such as a battery 62, are connected in series between the source lead 51 and the drain lead 53, so that the source eletcrode 41 and the source region 19 are poled negative relative to the drain electrode 42 and the drain region 21. The header 50 is electrically connected to the gate lead 52. A source 64 of signal potential and a second source of direct current potential, such as a battery 66, are connected in series between the control lead 52 and the source lead 51 so that the source lead 51 is biased positive relative to the gate lead 52.

The characteristic I–V curves of an offset gate MOS transistor fabricated according to this example are graphed in FIGURE 14. The graph is a plot of the source-drain current measured in milliamperes, against source-drain voltage, measured in volts, for different values of positive and negative gate-to-source bias, measured in volts. Depending on the times and temperatures of the process, the zero bias current may be increased or decreased. By increasing the period of treatment in a hydrogen-containing ambient, the conductivity of the channel in the device is increased, and hence the amount of current which flows at zero bias is increased.

For comparison, FIGURE 13 shows the characteristic I–V curves of a comparable prior art device. In the graph (FIGURE 14) of the I–V curves of the device made by the present method, the "knee" of each I–V curve is more abrupt, and the "knee" occurs at a lower drain voltage value, than in the plot (FIGURE 13) of I–V curves of a prior art device. This indicates that a larger undistorted output signal can be obtained from the device according to this example than from the prior art device.

Moreover, the individual I–V curves of the device of this example (FIGURE 14) are spaced further apart along the current axis than the I–V curves of the prior art device (FIGURE 13) thus indicating a higher transconductance value for the device of this example than for the prior art device.

*Example II*

Whereas in Example I, the silicon wafer was P type, and the conductive channel was N type, in this example the semiconductive wafer or slice 10 (FIGURES 1–12) consists of intrinsic silicon having a resistivity of about 100 ohm-cm., and the conductivity modifier diffused into the wafer is an acceptor such as boron. The steps of diffusing the conductivity modifier into selected portions of one wafer face 11 to form a pair of P type source and drain regions 19 and 21 in the wafer, thermally growing a silicon oxide coating 24 on the wafer surface without forming an inversion layer thereon by utilizing pure dry oxygen as the ambient while heating the wafer, and forming openings 27 and 28 in the silicon oxide coating 24 on said one wafer face 11 entirely within the surface boundary of the acceptor-diffused wafer regions 19 and 21, are similar to those described in Example I above. The wafer 10 is now heated in an ambient of ozone at a temperature of about 200° C. to 1000° C. to form a thin P type inversion layer 30 beneath the silicon oxide coating on said one wafer face 11. The P type inversion layer 30 serves as the conductive channel in the device of this example.

Metallic electrodes 41 and 43 are deposited on the two acceptor-diffused regions 19 and 21. A metallic gate electrode 42 is deposited on the silicon oxide layer 24 between electrodes 41 and 43. As in Example I, the gate electrode 42 covers only part of the conductive channel 30, and is offset so that one end of the gate electrode 42 slightly overlaps the source region, while the other end of the gate electrode extends over part of the conductive channel, leaving the remainder of the channel uncovered.

The wafer 10 is now reheated in an ambient of ozone to increase the conductivity of that portion 34 (FIGURE 11) of the channel 30 which is not covered by the electrode 42.

The subsequent steps of attaching leads 51, 52 and 53 to electrodes 41, 42 and 43 respectively, subdividing the wafer 10 into a plurality of units, and mounting and casing each unit, are similar to those described in connection with Example I.

The process of the foregoing examples may be utilized to fabricate devices with a wide variety of configurations. For example, the electrode configuration of a semiconductor device may be made circular and concentric, so that an annular gate or control electrode surrounds a central drain electrode, while an annular source electrode in turn surrounds the gate electrode. Alternatively, the source and drain electrodes may be made comb-like or interdigitated in form.

An advantage of the various methods of fabricating semiconductor devices described above is that the conductive channel 30 in each unit formed from a particular semiconductive slice exhibits uniform resistivity from unit to unit. Such uniform resistivity enables the production of a large number of devices with uniform and reproducible electrical characteristics.

Another advantage is that the conductive channel thus prepared is relatively thin, and relatively free from traps, so that current through the channel is easily modulated by the applied field generated by biasing the gate electrode.

Another feature of the invention is that the conductivity of the channel 30 may be monitored and adjusted to the desired values prior to completing the fabrication of the device, thus reducing the amount of scrap. If desired, the conductivity of the channel may be continuously monitored while the silicon body is being heated in a hydrogen-containing ambient, so that the process can be stopped when the desired value is obtained for the conductivity of the channel.

Still another advantage is that the method is simple, rapid, and inexpensive as compared to prior art methods for fabricating such conductive channels.

The embodiments described above are by way of illustration and explanation only, but not limitation. Other dense conductive metals such as tungsten, tantalum, and the like may be utilized for the electrodes instead of gold and silver. The conductive metal may be deposited by electroplating, or by electroless plating, instead of by evaporation. Various other modifications may be made by those skilled in the art without departing from the spirit and scope of the invention as described in the specification and the appended claims.

What is claimed is:

1. The method of forming a conductive channel in a crystalline semiconductive body, comprising the steps of:

forming an insulating coating on one face of said body;

heating said body in an ambient capable of altering the conductivity of a surface portion thereof to form in said body a conductive channel nuderneath said coating;

depositing a covering metallic electrode on only a portion of said coating, leaving the remaining portion of said coating uncovered; and, heating said body in an ambient capable of altering the conductivity of that portion of said one face which underlies said coating and is uncovered by said electrode.

2. The method of forming a non-uniform conductive channel in a silicon body, comprising the steps of:

forming an insulating coating on one face of said body by heating said body in a dry oxygen ambient;

heating said body in a reducing ambient to form in said body a conductive channel underneath said coating;

depositing a covering metallic electrode on only a portion of said coating, leaving the remaining portion of said coating uncovered; and, reheating said body in a reducing ambient to increase the conductivity of that portion of said one face which underlies said coating and is uncovered by said electrode.

3. The method of forming a non-uniform conductive chanel in a monocrystalline silicon wafer, comprising the steps of:

forming a silicon oxide coating on at least one face of said wafer by heating said wafer in a pure dry oxygen ambient;

heating said wafer in an ambient selected from the group consisting of hydrogen and mixtures of hydrogen with nonoxidizing gases to form in said wafer beneath said silicon oxide coating a thin conductive channel immediately adjacent said one face;

depositing a metallic electrode on said silicon oxide coating over a portion only of said conductive channel, leaving the remaining portion of said channel uncovered; and, reheating said wafer in a hydrogen-containing ambient to increase the conductivity of that portion only of said channel uncovered by said electrode.

4. The method of fabricating a semiconductor device, comprising the steps of:

preparing a high resistivity crystalline semiconductive wafer with two opposing major faces;

depositing an insulating masking coating on at least one said major face;

removing predetermined portions of said coating to expose two spaced areas on said one major face;

forming two spaced low resistivity regions in said wafer immediately adjacent said two exposed spaced areas respectively;

treating said wafer in an ambient capable of altering the conductivity of said one wafer face beneath said coating;

depositing a first conductive electrode on one said exposed area;

depositing a second conductive electrode on the other said exposed area;

depositing a third conductive electrode on said insulating coating over a portion only of the space between said two low resistivity regions, one end of said third electrode being closer to one said low resistivity region than the other end of said electrode is to the other said low resistivity region; and, treating said wafer in an ambient capable of altering the conductivity of that portion only of said one wafer face which is beneath said coating but is not beneath said electrodes.

5. The method of fabricating a semiconductor device, comprising the steps of:

preparing a high resistivity crystalline silicon wafer with two opposing major faces;

depositing an insulating masking coating on at least one said major face;

removing predetermined portions of said coating to expose two spaced areas on said one major face;

forming two spaced low resistivity regions in said wafer immediately adjacent said two exposed spaced areas respectively;

treating said wafer in an ambient capable of altering the conductivity of said one wafer face beneath said coating;

depositing a first conductive electrode on one said exposed area;

depositing a second conductive electrode on the other said exposed area;

depositing a third conductive electrode on said insulating coating to cover a portion only of said one wafer face between said two low resistivity regions, one end of said third electrode being closer to one said low resistivity region than the other end of said third electrode is to the other said low resistivity region; and, treating said wafer in an ambient capable of altering the conductivity of the uncovered portion only of said one wafer face beneath said coating.

6. The method of fabricating a semiconductor device, comprising the steps of:

preparing a high resistivity monocrystalline silicon wafer with two opposing major faces;

depositing an insulating silicon oxide coating on at least one said major face;

removing predetermined portions of said coating to expose two spaced areas on said one major face;

forming two spaced low resistivity regions in said wafer immediately adjacent said two exposed spaced areas respectively;

treating said wafer in an ambient capable of altering the conductivity of said one wafer face beneath said coating;

depositing a first conductive electrode on one said exposed area;

depositing a second conductive electrode on the other said exposed area;

depositing a third conductive electrode on said insulating coating over a portion only of the space between said two low resistivity regions, one end of said third electrode being closer to one said low resistivity region than the other end of said third electrode is to the other said low resistivity region; and, treating said wafer in an ambient capable of altering the conductivity of that portion only of said one wafer face which is beneath said coating but is not beneath said electrodes.

7. The method of fabricating a semiconductor device, comprising the steps of:

preparing a high resistivity monocrystalline silicon wafer with two opposing major faces;

depositing an insulating silicon oxide coating on at least one said major face;

removing predetermined portions of said coating to expose two spaced areas on said one major face;

forming two spaced low resistivity regions in said wafer immediately adjacent said two exposed spaced areas respectively;

treating said wafer in an ambient capable of increasing the conductivity of said one wafer face beneath said coating to form a conductive channel between said two spaced regions;

depositing a first metallic electrode on one said exposed area;

depositing a second metallic electrode on the other said exposed area;

depositing a third metallic electrode on said insulating coating over a portion only of the space between said two low resistivity regions, one end of said third electrode being closer to one said low resistivity region than the other end of said third electrode is to the other said low resistivity region; and, treating said wafer in an ambient capable of increasing the conductivity of that portion only of said channel which is beneath said coating but is not beneath said electrodes.

8. The method of fabricating a semiconductor device, comprising the steps of:

preparing a high resistivity crystalline semiconductive wafer with two opposing major faces;

depositing an insulating masking coating on one said major face;

removing predetermined portions of said coating to expose two spaced areas on said one major face;

forming two spaced low resistivity regions in said wafer immediately adjacent said two exposed spaced areas respectively;

heating said wafer in a reducing ambient for a time and at a temperature sufficient to form in said wafer a conductive channel adjacent said one wafer face;

depositing a first conductive electrode on one said exposed area;

depositing a second conductive electrode on the other said exposed area;

depositing a third conductive electrode on said insulating coating over a portion only of the space between said two low resistivity regions, one end of said third electrode being closer to one said low resistivity region than the other end of said third electrode is to the other said low resistivity region; and, heating said wafer in a reducing ambient, the time and temperature of said heating step being sufficient to increase the conductivity of the portion of said conductive channel which is beneath said coating but is not beneath said electrodes.

9. The method of fabricating a semiconductor device, comprising the steps of:

preparing a high resistivity monocrystalline silicon wafer with two opposing major faces;

depositing an insulating masking coating on one said major face;

removing predetermined portions of said coating to expose two spaced areas on said one major face;

forming two spaced low resistivity regions in said wafer immediately adjacent said two exposed spaced areas respectively;

heating said wafer in an ambient selected from the group consisting of hydrogen and mixtures of hydrogen with non-oxidizing gases, the time and temperature of said heating step being sufficient to form in said body a conductive channel immediately adjacent said one wafer face beneath said coating;

depositing a first conductive electrode on one said exposed area;

depositing a second conductive electrode on the other said exposed area;

depositing a third conductive electrode on said insulating coating over a portion only of the space between said two low resistivity regions, one end of said third electrode being closer to one said low resistivity region than the other end of said third electrode is to the other said low resistivity region; and, heating said wafer in an ambient selected from the group consisting of hydrogen and mixtures of hydrogen with non-oxidizing gases, the time and temperature of said heating step being sufficient to increase the conductivity of that portion only of said conductive channel which is beneath said coating but is not beneath said third electrode.

10. In the method of fabricating a field effect semiconductor device comprising a semiconductor body having therein a non-uniform conductive channel extending between source and drain regions, the steps of:

providing said source and drain regions in said body;

providing a substantially uniform conductive path in said body between said regions;

depositing an insulating coating on portions of said body;

depositing a metallic coating on portions only of said insulating coating so that areas thereof overlying part of said path are uncovered; and, heating said body in an ambient capable of altering the conductivity of said part of said path to provide said non-uniform conductive channel.

References Cited

UNITED STATES PATENTS

| | | | |
|---|---|---|---|
| 3,102,230 | 8/1963 | Kahng. | |
| 3,183,129 | 5/1965 | Tripp | 148—187 x |
| 3,193,418 | 7/1965 | Cooper | 148—189 |
| 3,203,840 | 8/1965 | Harris | 148—187 |
| 3,226,611 | 12/1965 | Haenichen | 317—234 |

WILLIAM I. BROOKS, *Primary Examiner.*